United States Patent [19]
Sandhu

[11] Patent Number: 5,517,130
[45] Date of Patent: May 14, 1996

[54] METHOD AND STRUCTURE FOR REDUCING NOISE IN OUTPUT BUFFER CIRCUITS

[75] Inventor: Bal S. Sandhu, Fremont, Calif.

[73] Assignee: Sun Microsystems, Inc., Mountain View, Calif.

[21] Appl. No.: 359,902

[22] Filed: Dec. 20, 1994

[51] Int. Cl.[6] .................................................. H03K 17/16
[52] U.S. Cl. ................................. 326/27; 326/83; 326/87
[58] Field of Search ................................... 326/87, 83, 86

[56] References Cited

U.S. PATENT DOCUMENTS

| | | |
|---|---|---|
| 4,725,747 | 2/1988 | Stein et al. . |
| 4,789,793 | 12/1988 | Ehni et al. . |
| 4,820,942 | 4/1989 | Chan . |
| 4,885,485 | 12/1989 | Leake et al. . |
| 4,918,339 | 4/1990 | Shigeo et al. . |
| 4,947,063 | 8/1990 | O'Shaughnessy et al. . |
| 4,959,561 | 9/1990 | McDermott et al. . |
| 4,959,565 | 9/1990 | Knecht et al. . |
| 4,992,676 | 2/1991 | Gerosa ........................ 326/87 |
| 5,028,817 | 7/1991 | Patil . |
| 5,036,222 | 7/1991 | Davis .......................... 326/87 |
| 5,089,722 | 2/1992 | Amedeo ....................... 326/87 |
| 5,103,118 | 4/1992 | Peterson ....................... 326/87 |
| 5,111,075 | 5/1992 | Ferry .......................... 326/87 |
| 5,124,579 | 6/1992 | Naghshineh .................... 326/83 |
| 5,216,299 | 6/1993 | Wanlass . |
| 5,220,209 | 6/1993 | Seymour ....................... 326/87 |
| 5,296,758 | 3/1994 | Sandhu . |

FOREIGN PATENT DOCUMENTS 0292641  11/1988  European Pat. Off. .

*Primary Examiner*—Edward P. Westin
*Assistant Examiner*—Andrew Sanders
*Attorney, Agent, or Firm*—Steven F. Caserza; Flehr, Hohbach, Test, Albritton & Herbert

[57] ABSTRACT

A method and structure for controlling ground bounce and power supply noise during switching is provided in which a plurality of pull-up and/or pull-down transistors are provided whose turn on during switching is controlled in order to provide the desired slew rate in order to control the deleterious effects of ground bounce and power supply noise. In one embodiment, a plurality of pass transistors are used in order to delay a logical signal in order to control the slew rate. In one embodiment, these pass transistors are sensitive to ground bounce, providing a positive feedback mechanism to further enhance the control of ground bounce. In one embodiment, an RC network is conveniently formed in order to control slew rate, and in one embodiment the RC network is sensitive to ground bounce, providing positive feedback in order to further control the slew rate as a result of detected ground bounce.

24 Claims, 6 Drawing Sheets

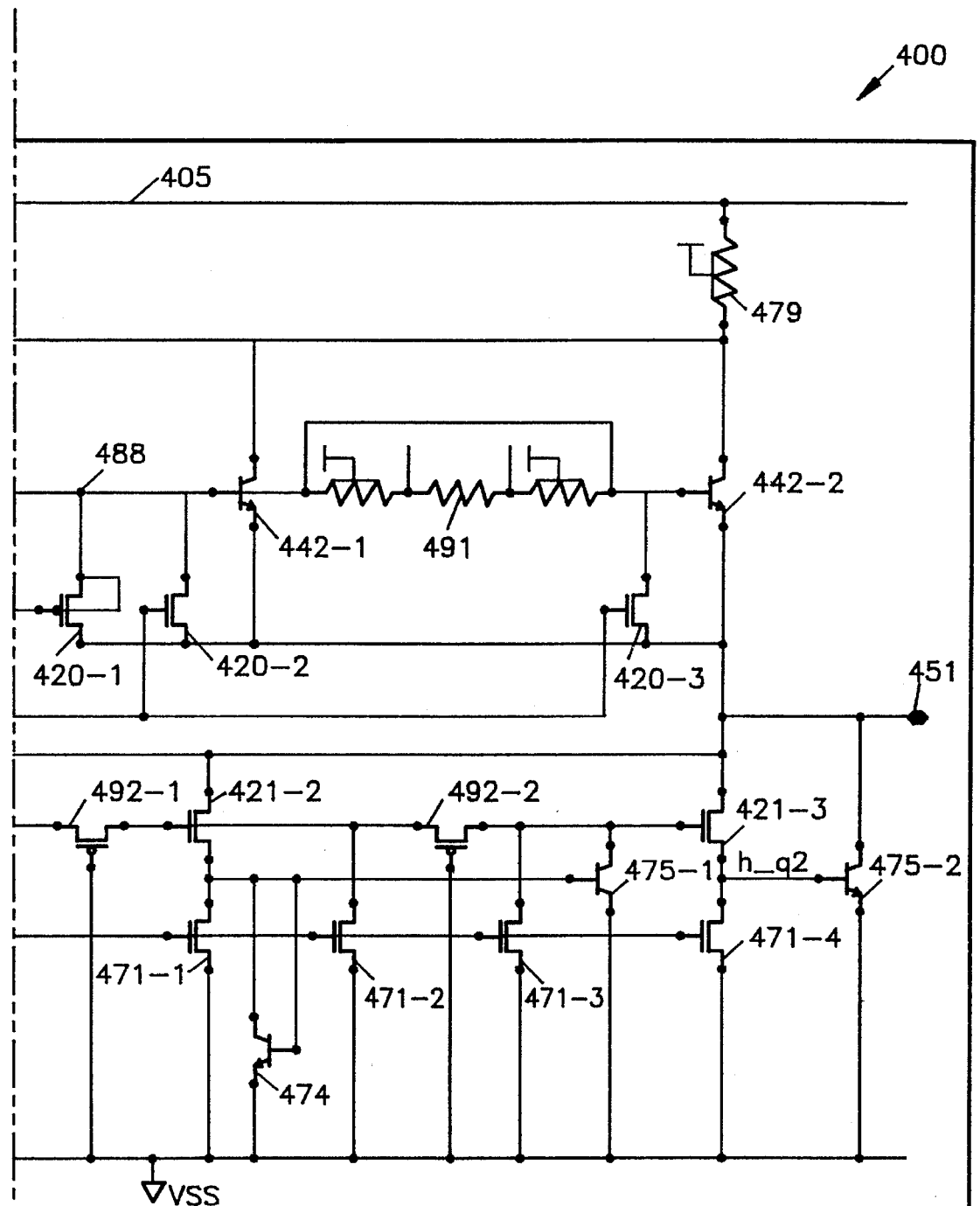
FIG. 4B
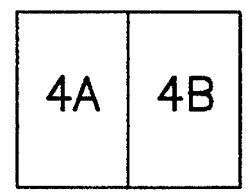

METHOD AND STRUCTURE FOR REDUCING NOISE IN OUTPUT BUFFER CIRCUITS

BACKGROUND OF THE INVENTION

1. Field of the Invention

The present invention minimizes transient noise during the switching operation of output buffers by employing a novel method and apparatus for controlling the slew rate of the output buffer data transitions.

2. Description of the Related Art

When integrated circuits are required to drive high capacitive loads with output buffers designed to switch at high frequencies, for example above 100 MHz, high transient currents are generated creating power supply and ground bus noise. This can cause deleterious effects to adjacent circuits in the system.

An integrated circuit (IC) includes bonding pads to which thin bond wires are attached to connect the IC to the IC package lead frame, which in turn is connected to a printed circuit board. The leads of the package lead frame have a certain amount of inductance, as do the bond wires. These inductances have a cumulative effect in generating noise on the power and ground supplies as the speed of integrated circuits increase, which can be understood with reference to the circuit model of FIG. 1.

To meet higher system performance it is desirable to have high speed output buffer circuits driving large capacitive loads. However, the faster switching rate causes an increase in the rate of change of current which in turn generates a higher voltage drop across the inductors. The voltage drop across an inductance is equal to the inductance multiplied by the rate of change of current. This is expressed as $L * di/dt$, where L is the value of the inductance and $di/dt$ is the rate of the change of current. Hence, the larger the $di/dt$ (i.e., the faster the switching speed) for a given value of inductance, the larger the voltage drop across the inductor.

The output load must be charged and discharged at high speeds. The discharge of the output path occurs rapidly and large current flows through the inductance. Typically, the output current sinking capability required for a given MOSFET output buffer circuit is in the range of 24 mA per output and the greater the number of outputs switching simultaneously, the larger will be the ground bounce.

Similarly, the noise associated with pull-up transistors causes current surges and voltage transients on the power supply lines due to the $L * di/dt$ voltage drop across the Vcc bonding wire.

FIG. 2 depicts ground bounce noise during the switching of an output signal from high to low, and its effect on the output signal.

FIG. 3 is a prior art output buffer circuit 300. Output buffer 300 is enabled when output enable signal oenb is high. When enabled, output buffer 300 is non-inverting and buffers the data received on input lead 301 to drive the capacitive load coupled to output lead 351. When the input data is a logic one, input circuit 380 (which includes N channel transistors 312 and 313, and P channel transistor 311) drives both en_top_ and en_bot signals low. This is accomplished by P channel pull-up transistor 311 turning off and N channel pull-down transistor 313 turning on, which pulls down the en_hot signal and, through turned on N channel transistor 312, pulls down the en_top_ signal. With the en_top_ signal low, the pull-up transistor chain, consisting of P channel transistor 317 and NPN transistor 341, is enabled and N channel transistors 318 and 319 are disabled. This provides base drive to NPN pull-up transistor 342, and with a low en_top_ signal, N channel transistor 320 is off. With the en_bot signal low, N channel pull-down path transistors 321 and 322 are turned off, and N channel transistor 323, driven by inverter 332, is turned on, keeping NPN pull-down transistor 343 turned off. Hence, bipolar transistors 341 and 342 are on and bipolar transistor 343 is off, causing output lead 351 to be pulled up to VCC - 2 Vbe, where Vbe is the base-emitter forward voltage (typically about 0.8 v) of NPN transistors 341 and 342, with no voltage drop across P channel transistor 317.

Conversely, when the input data is a logic zero, signals en_top_ and en_bot are driven high by input circuit 380, with P channel pull-up transistor 311 turned on to pull up the en_top_ signal, and via turned on N channel transistor 312, pulling up the en_bot signal. This causes the pull-down path established by the emitter-collector path of NPN pull-down transistor 343 established by the collector-emitter path of NPN pull-up transistor 342 to be enabled and the pull-up path established by the collector-emitter path of NPN pull-up transistor 342 to be disabled. This causes output lead 351 to be pulled low, to VSS (ground).

Output buffer 380 does not have any ability to control ground bounce that is generated when output lead 351 is discharged to VSS through the pull-down path of transistors 321, 322, and 343. Hence, this creates an undesirable situation that can cause a system problem.

A number of prior art output circuits which attempt to reduce the effects of ground bounce are known. U.S. Pat. No. 5,296,758 to Sandhu includes compensating devices positioned between the input line and the gate of the pull-down transistor to regulate drive current to the pull-down transistor in the presence of ground bounce. Other prior art circuits, such as described in U.S. Pat. No. 4,959,565 to Knecht et. al., include a plurality of pull-up transistors connected in parallel and/or a plurality of pull-down transistors connected in parallel, whose turn on are distributed in time, in order to reduce the effects of ground bounce. However, such prior art circuits are not completely effective in removing the effects of ground bounce and are not responsive to the effects of ground bounce itself during their operation to attempt to control the effects of ground bounce.

SUMMARY OF THE INVENTION

In accordance with the teachings of this invention, a method and structure for controlling ground bounce and power supply noise during switching is provided. In accordance with this invention, a plurality of pull-up and/or pull-down transistors are provided whose turn on during switching is controlled in order to provide the desired slew rate in order to control the deleterious effects of ground bounce and power supply noise. In one embodiment, a plurality of pass transistors are used in order to delay a logical signal in order to control the slew rate. In one embodiment, these pass transistors are sensitive to ground bounce, providing a positive feedback mechanism to further enhance the control of ground bounce. In one embodiment, an RC network is conveniently formed in order to control slew rate, and in one embodiment the RC network is sensitive to ground bounce, providing positive feedback in order to further control the slew rate as a result of detected ground bounce.

BRIEF DESCRIPTION OF THE DRAWINGS

FIGS. 4a and 4b show a schematic diagram of one embodiment of a novel output buffer circuit constructed in accordance with the teachings of this invention.

DETAILED DESCRIPTION OF THE INVENTION

Figure 1:
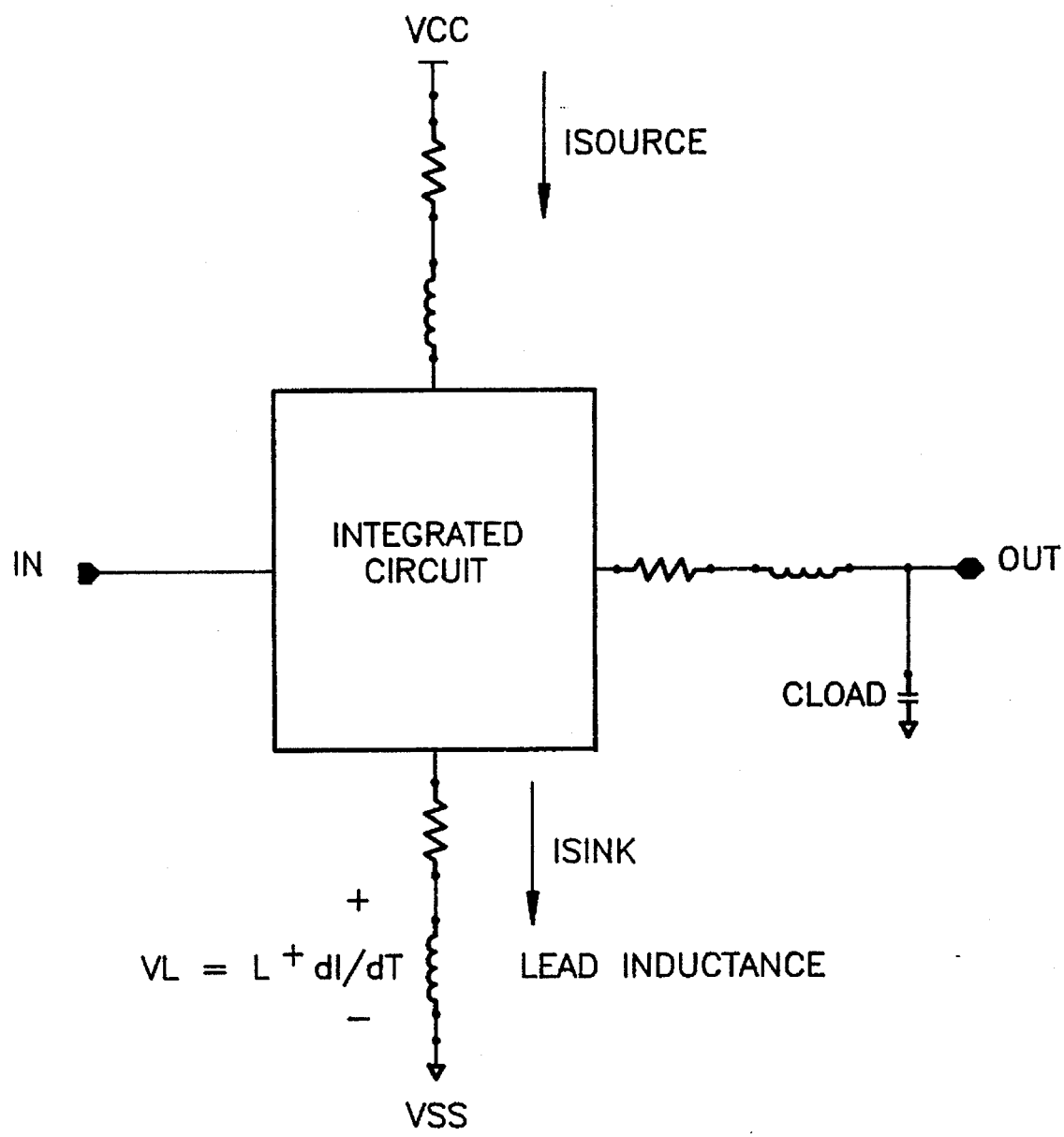
FIG. 1 is a prior art model of an integrated circuit showing resistance and inductance associated with bond wires and package leads.
Figure 2:
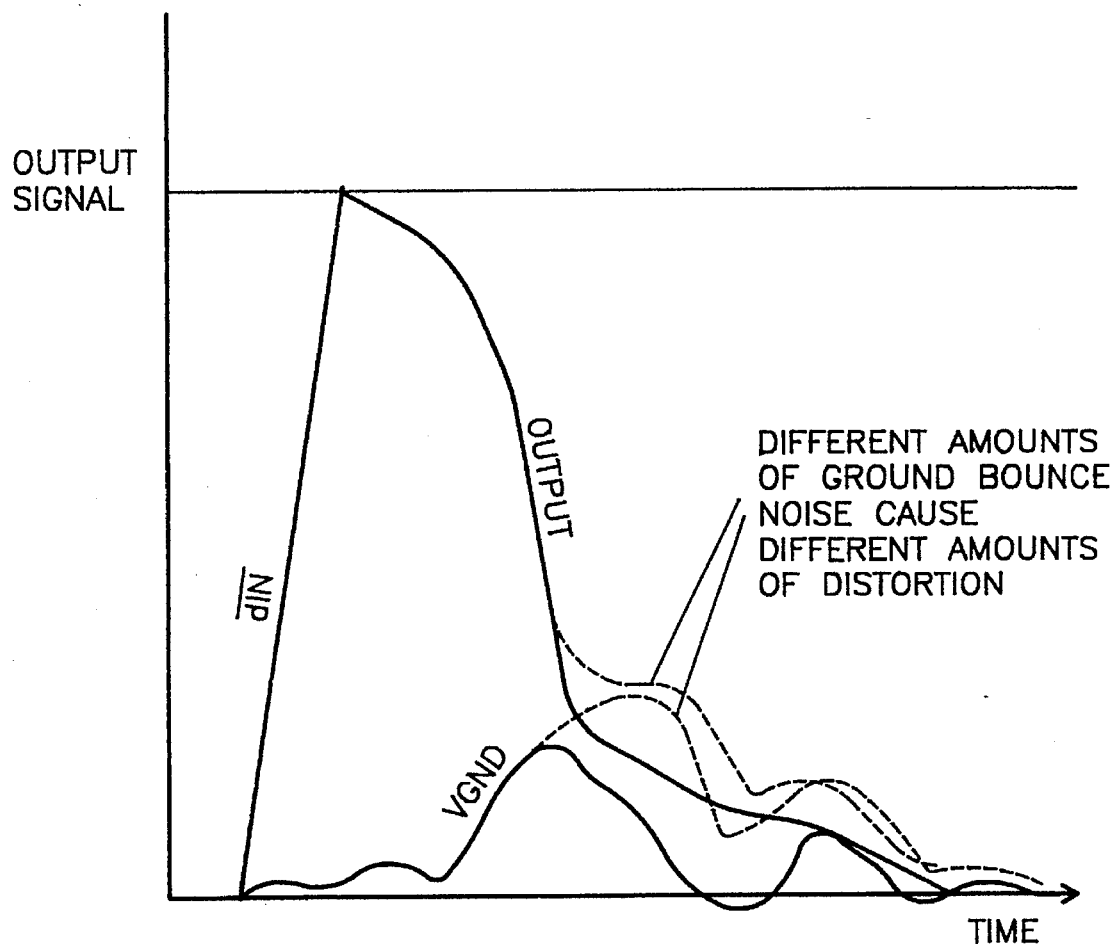
FIG. 2 is a graph depicting the effects of ground bounce on ground voltage and its adverse effect on a switching output voltage.

The present invention provides a method and structure for controlling ground bounce while maintaining a reasonable high switching speed of the output buffer. Referring to FIG. 4, in one embodiment input stage 480 of output buffer circuit 400, including P channel transistors 411, 414, and 415, N channel transistors 412, 413, and 416 and inverter 431, is conveniently formed to be the same as input stage 380 of FIG. 3. Input stage 480 receives the input signal applied to input lead 401 and provides signals en_top_ and en_bot, respectively.

When input data applied to input lead 401 switches from high to low, signals en_top and en_bot are both driven high by input circuit 480. As signal en_top_ goes high, P channel transistor 417 is turned off and N channel transistors 418 and 419 are turned on. Hence pull-up node 488 is discharged to VSS (ground) through N channel transistors 418 and 419, thereby turning off NPN pull-up transistors 442-1 and 442-2. With signal en_bot high, N channel transistor 421-1 turns on and starts pulling down output lead 451 towards VSS. In addition, P channel transistor 492-1 starts passing a delayed version of the low-to-high transition of signal en_bot (since transistor 492-1 acts as a variable resistor, due to channel resistance and the ground bounce applied to its gate) to turn on the gate of N channel transistor 421-2, further pulling down output lead 451. The source of transistor 421-2 drives the base of NPN transistor 475-1 to further pull down output lead 451. However, some of the current supplied by transistor 421-2 is "stolen" away by the inverter formed by P channel transistor 465 and N channel transistors 466 and 467 via a delayed turn-off of transistor 471-1. In one embodiment, this inverter configuration is designed to, in response to the low to high transition of signal en_bot, slowly switch its output signal low by the RC network formed by N channel transistor 469 (serving as a capacitor) and the resistance of N channel transistors 466 and 467 connected in series.

Similarly, the turn-on of the gate of N channel transistor 421-3 is delayed by the resistance of P channel transistor 492-2. This has the effect of delaying the turn on of NPN pull-down transistor 475-2. Hence, the turn on of NPN pull-down transistors 475-1 and 475-2 is controlled by the RC time delay provided by the inverter formed by transistors 465, 466, and 467 and the delay through P channel transistors 492-1 and 492-2. By dividing in two the size of pull-down transistors 475-2 and 475-1 (with respect to the size of output pull-down transistor 343 of the prior art circuit of FIG. 3) required to drive the large capacitive load of output lead 451, and by further providing a method and structure for controlling the turn on characteristics of the transistors driving pull-down transistors 475-2 and 475-1, slew rate of the output buffer transition is desirably controlled to better maintain a constant dI/dT and therefore control ground bounce. The delay through P channel transistors 492-1 and 492-2 is set by the channel width (w) and the channel length (l) of these transistors. The RC delay provided by transistors 465, 466, 467, and 469 is set by the size of these transistors and the size of the capacitor formed by transistor 469.

Figure 3:
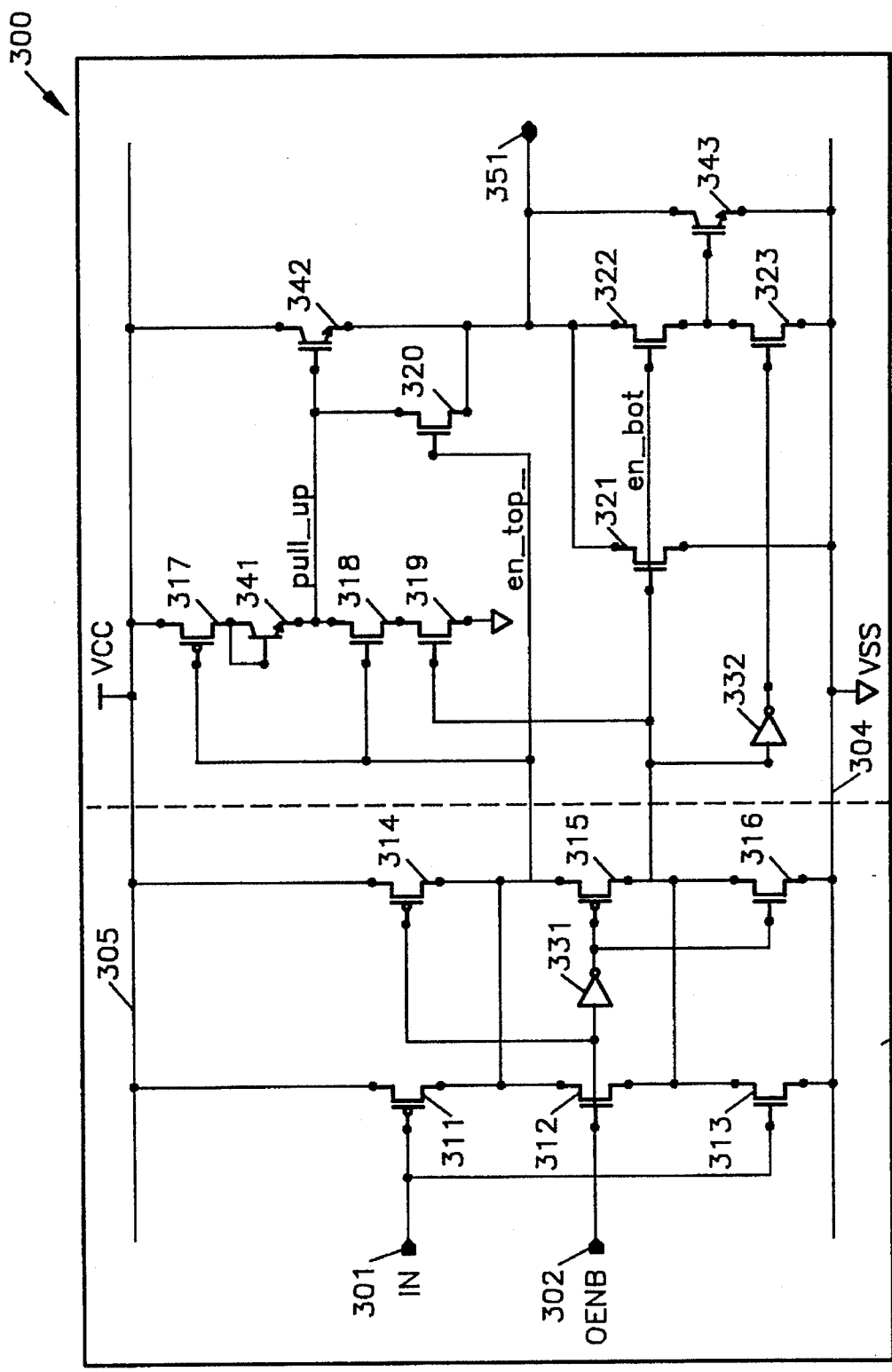
FIG. 3 is a schematic diagram of a typical prior art output buffer circuit.
Figure 4A:
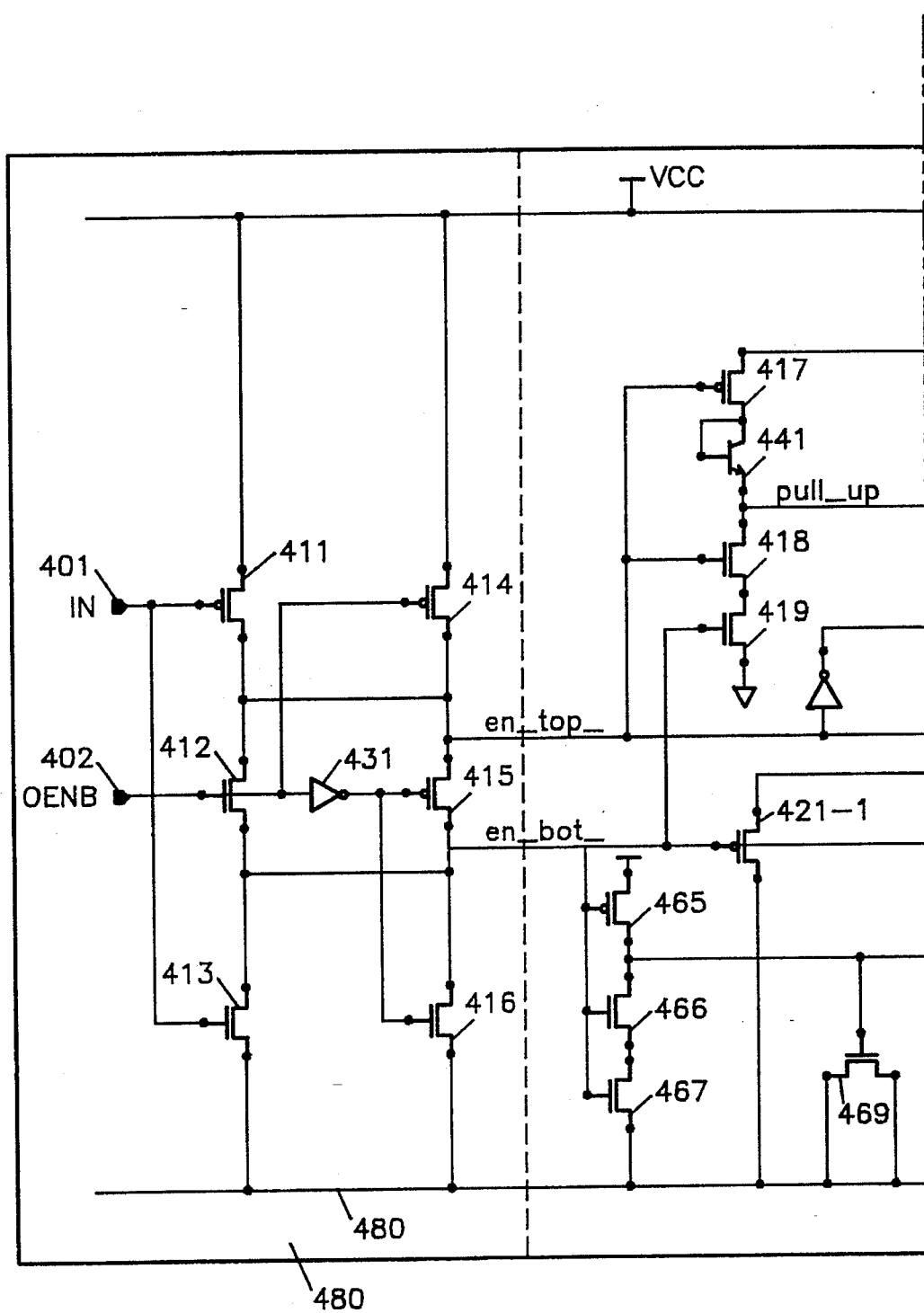

In one embodiment of circuit 400 of FIG. 4, the size of bipolar transistors 442-1, 442-2, 475-1, and 475-2 are each made to be approximately half the size of bipolar transistors 342 and 343 of FIG. 3, to provide the same total pull-up and pull-down current capability, respectively. Alternatively, the sizes of pull-up transistors 442-1 and 442-2, and pull-down transistors 475-1 and 475-2, are sized to not be equal to their respective pair, in order to advance or retard the pull-up and pull-down currents. In the example of FIG. 4 two such pull-up and two such pull-down transistors are depicted. However, according to various embodiments of the present invention, a greater number of pull-up and pull-down transistors, along with appropriate driving circuitry, may be used.

In one embodiment, a feedback mechanism is included which allows the delay through P channel transistors 492-1 and 492-2 to change as ground voltage VSS starts to rise. Since the gates of P channel transistors 492-1 and 492-2 are connected to VSS lead 404, P channel transistors 492-1 and 492-2 are always on. However, as ground voltage starts to rise, the drive of P channel transistors 492-1 and 492-2 starts to decrease and hence the delay through transistors 492-1 and 492-2 increases. Also, as ground voltage VSS increases, the gate of transistor 469 also rises due to a capacitive coupling effect. This has the effect of keeping transistors 471-1, 471-2, and 471-3 turned on longer, thus delaying the rise of the base voltage on pull-down transistors 475-2 and 475-1, delaying the output voltage pull-down, lowering dI/dT, and thus reducing ground bounce. Transistor 474 serves as a current mirror, which mirrors the current through transistor 475-1, and also ensures that the base voltage of transistor 475-1 does not rise above Vbe.

In the embodiment of FIG. 4, the pull-up path also provides a method and structure for reducing overshoot of the voltage provided on output lead 451 during the low to high transition of the output voltage. This is achieved by connecting resistors 479 and 491 in the pull-up circuitry. Resistor 479 limits the pull-up current and provides a RC delay to pull-up node 488. Resistor 491, which can be formed as a plurality of series connected resistors in order to allow simple redesign by bypassing selected resistors when the circuit is to be used at a different power supply voltage level, delays turning on NPN pull-up transistor 442-2 by effectively disabling this transistor during AC switching, thus decreasing the voltage drop across resistor 479 and adverse effects caused by the inductance of the Vcc bonding wire. With resistors 491 connected, the turning on of NPN transistor 442-2 is delayed such that the primary current drive to charge the capacitance load on output lead 451 is from NPN pull-up transistor 442-1. Since the voltage on the emitter of transistor 442-1 increases faster than the base of transistor 442-2, transistor 442-2 stays off during the switching and hence provides less voltage drop across resistor 479. Transistors 420-1, 420-2, and 420-3 are turned on when output buffer circuit 400 is tri-stated by taking the oenb output enable signal low, thereby disabling output buffer 400. At this time, signal en_top_ goes high and signal en_bot goes low. Hence, pull-down transistors 421-1 through 421-3 are all off and pull-up transistors 442-1 and 442-2 are off, but have their base-emitter voltages equalized by turned on transistors 420-1 through 420-3, thereby avoiding a breakdown stress condition across the base-emitter junctions of transistors 442-1 and 442-3.

Figure 5:
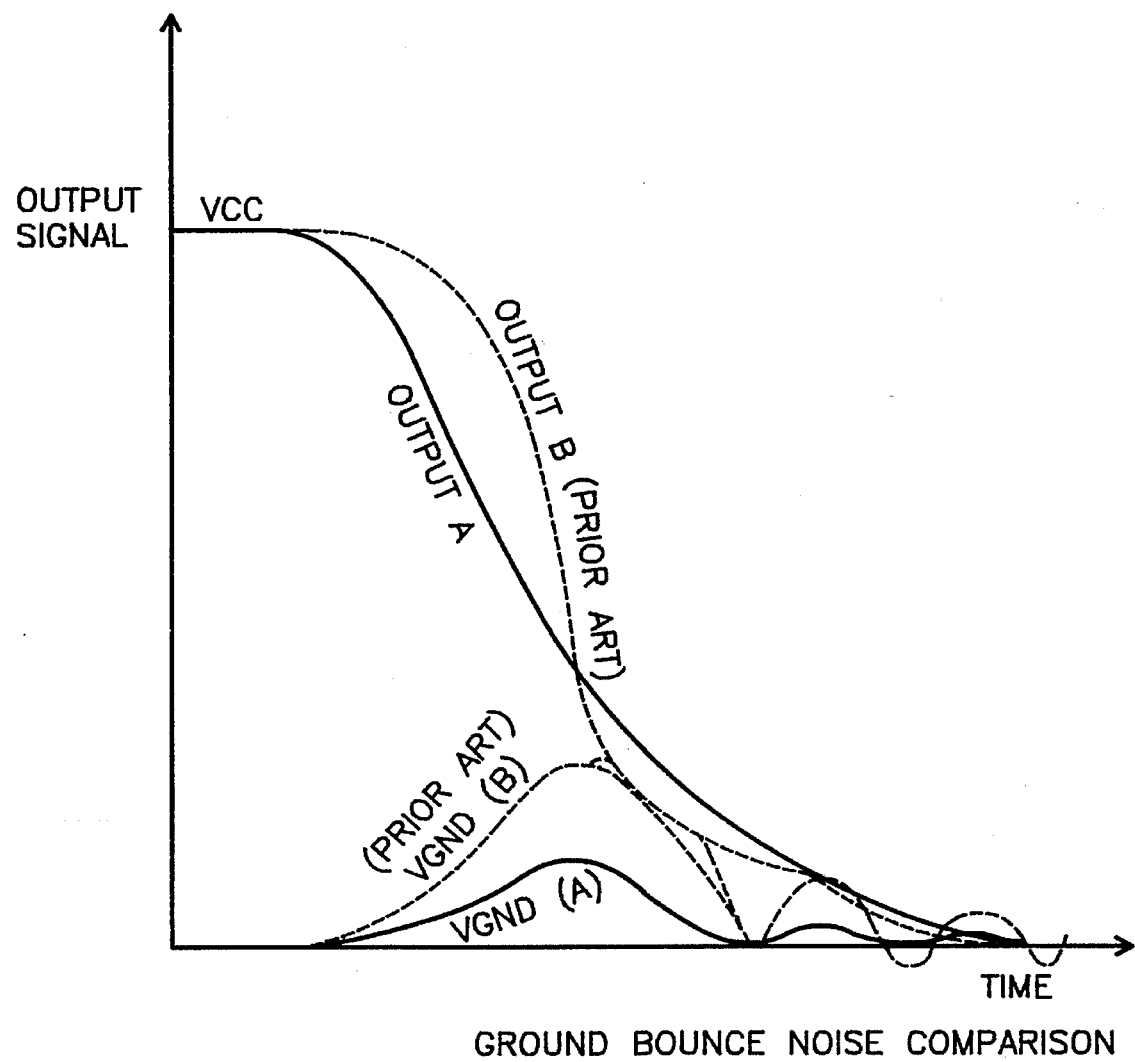
FIG. 5 is a graph depicting the reduction in ground bounce and improvement in output signal characteristics achieved in accordance with the teachings of this invention.

FIG. 5 is a graph depicting the improvement in ground bounce and output voltage characteristics achieved in accordance with this invention. As shown in FIG. 5, in accordance with the teachings of this invention ground bounce (as depicted in curve $V_{Gnd(A)}$ is significantly reduced as compared with a typical prior art ground bounce signal, as depicted by curve $V_{Gnd(B)}$. This results in a more desirable switching characteristic of the output signal (output A) as compared with the prior art output signal (output B) which is adversely effected by the effects of ground bounce.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A pull-down circuit comprising:

an output terminal;

a control signal terminal for receiving a control signal when said circuit is to operate to pull down said output terminal;

a plurality of pull-down transistors having their current carrying terminals coupled between ground and said output terminal, each of said pull-down transistors having a control terminal; and a control circuit having:
an input lead coupled to said control signal terminal;
a plurality of driver transistors, each coupled for driving an associated one of said pull-down transistors; and
a plurality of series connected pass transistors, a first of said pass transistors coupled between said input lead and the control terminal of a first of said driver transistors, and subsequent ones of said pass transistors coupled between a preceding pass transistor and the control terminal of a subsequent one of said driver transistors, the control terminals of at least some of said pass transistors being connected to ground.

2. A pull-down circuit as in claim 1 which further comprises an additional pull-down transistor having its current carrying leads coupled between said output terminal and ground, and its control terminal coupled to said input lead of said control circuit.

3. A pull-down circuit as in claim 1 which further comprises a plurality of discharge transistors, each having a current carrying path coupled between the control terminal of an associated one of said pull-down transistors and ground.

4. A pull-down circuit as in claim 3 which further comprises an inverter having an input lead coupled to said input lead of said control circuit, and an output lead coupled to the control terminals of said discharge transistors.

5. A pull-down circuit as in claim 4 which further comprises a capacitor coupled to said output lead of said inverter to delay the operation of said discharge transistors.

6. A pull-down circuit as in claim 5 wherein said capacitor is coupled between said output lead of said inverter and ground.

7. A pull-down circuit as in claim 6 wherein said capacitor comprises an MOS transistor having its gate serving as a first lead and at least one source/drain region serving as a second lead of said capacitor.

8. A pull-down circuit as in claim 4 which further comprises one or more transistors coupled to the output leads of one or more of said series connected pass transistors and ground, and having control terminals coupled to said output lead of said inverter.

9. An integrated circuit having a plurality of pull-down circuits, each said pull-down circuit being associated with an I/O lead of said integrated circuit, each said pull-down circuit comprising:

a control signal terminal for receiving a control signal when said circuit is to operate to pull down its associated one of said I/O leads;

a plurality of pull-down transistors having their current carrying terminals coupled between ground and said I/O lead, each of said pull-down transistors having a control terminal;

a control circuit having:
an input lead coupled to said control signal terminal;
a plurality of driver transistors, each coupled for driving an associated one of said pull-down transistors;
a plurality of series connected pass transistors, a first of said pass transistors coupled between said input lead and the control terminal of a first of said driver transistors, and subsequent ones of said pass transistors coupled between a preceding pass transistor and the control terminal of a subsequent one of said driver transistors, the control terminals of at least some of said pass transistors being connected to ground.

10. An integrated circuit as in claim 9 wherein one or more of said pull-down circuits further comprises an additional pull-down transistor having its current carrying leads coupled between said I/O lead and ground, and its control terminal coupled to said input lead of said control circuit.

11. An integrated circuit as in claim 9 wherein one or more of said pull-down circuits further comprises a plurality of discharge transistors, each having a current carrying path coupled between the control terminal of an associated one of said pull-down transistors and ground.

12. An integrated circuit as in claim 11 wherein one or more of said pull-down circuits further comprises an inverter having an input lead coupled to said input lead of said control circuit, and an output lead coupled to the control terminals of said discharge transistors.

13. An integrated circuit as in claim 12 wherein one or more of said pull-down circuits further comprises a capacitor coupled to said output lead of said inverter to delay the operation of said discharge transistors.

14. An integrated circuit as in claim 13 wherein in one or more of said pull-down circuits said capacitor is coupled between said output lead of said inverter and ground.

15. An integrated circuit as in claim 13 wherein in one or more of said pull-down circuits said capacitor comprises an MOS transistor having its gate serving as a first lead and at least one source/drain region serving as a second lead of said capacitor.

16. An integrated circuit as in claim 9 wherein one or more of said pull-down circuits further comprises one or more transistors coupled to the output leads of one or more of said series connected pass transistors and ground, and having control terminals coupled to said output lead of said inverter.

17. A method for controlling the slew rate of a signal provided on an output terminal comprising the steps of:

providing a pull-down circuit coupled to said output terminal comprising:

providing a control signal terminal for receiving a control signal when said circuit is to operate to pull down said output terminal;

providing a plurality of pull-down transistors having their current carrying terminals coupled between ground and said output terminal, each of said pull-down transistors having a control terminal; and providing a control circuit having:
- an input lead coupled to said control signal terminal;
- a plurality of driver transistors, each coupled for driving an associated one of said pull-down transistors; and
- a plurality of series connected pass transistors, a first of said pass transistors coupled between said input lead and the control terminal of a first of said driver transistors, and subsequent ones of said pass transistors coupled between a preceding pass transistor and the control terminal of a subsequent one of said driver transistors, the control terminals of at least some of said pass transistors being connected to ground.

18. A method as in claim 17 which further comprises the step of providing an additional pull-down transistor having its current carrying leads coupled between said output terminal and ground, and its control terminal coupled to said input lead of said control circuit.

19. A method as in claim 17 which further comprises the step of providing a plurality of discharge transistors, each having a current carrying path coupled between the control terminal of an associated one of said pull-down transistors and ground.

20. A method as in claim 19 which further comprises the step of providing an inverter having an input lead coupled to said input lead of said control circuit, and an output lead coupled to the control terminals of said discharge transistors.

21. A method as in claim 20 which further comprises the step of providing a capacitor coupled to said output lead of said inverter to delay the operation of said discharge transistors.

22. A method as in claim 21 wherein said capacitor is coupled between said output lead of said inverter and ground.

23. A method as in claim 22 wherein said capacitor comprises an MOS transistor having its gate serving as a first lead and at least one source/drain region serving as a second lead of said capacitor.

24. A method as in claim 20 which further comprises the step of providing one or more transistors coupled to the output leads of one or more of said series connected pass transistors and ground, and having control terminals coupled to said output lead of said inverter.

* * * * *